United States Patent

[11] 3,597,625

[72] Inventors Hisayoshi Yanai;
Toshiaki Ikoma; Takayuki Sugeta; Yasuo Matsukura; Kuniichi Ohta, all of Tokyo, Japan

[21] Appl. No. 771,492
[22] Filed Oct. 29, 1968
[45] Patented Aug. 3, 1971
[73] Assignee Nippon Electric Company, Limited Tokyo, Japan
[32] Priority Oct. 31, 1967
[33] Japan
[31] 42/70120

[54] NEURISTOR ELEMENT EMPLOYING BULK EFFECT SEMICONDUCTOR DEVICES

2 Claims, 5 Drawing Figs.

Figure 1A:
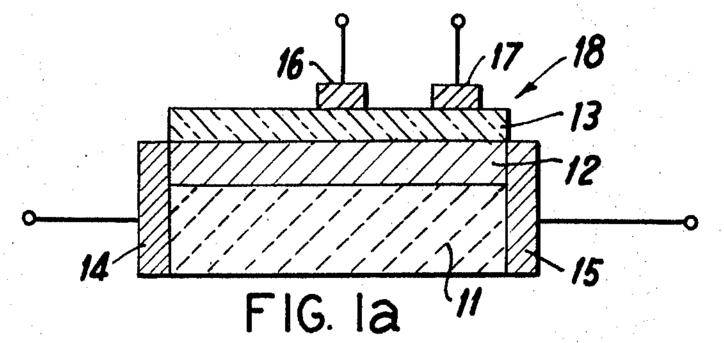

[52] U.S. Cl. .......... 307/201, 307/299, 331/107 G
[51] Int. Cl. .......... H03k 19/08
[50] Field of Search .......... 307/201, 299; 331/107 G

[56] References Cited
UNITED STATES PATENTS
3,452,221 6/1969 Gunn .......... 307/299

*Primary Examiner*—Roy Lake
*Assistant Examiner*—Darwin R. Hostetter
*Attorney*—Hopgood and Calimafde ABSTRACT: A neuristor element is described which is formed of a pair of Gunn effect elements using bulk negative resistance effect materials capable of forming high electric field layers in the elements upon the application of electric field intensities of preselected values within the materials. The elements are so coupled to one another that the initiation of a high electric field layer in one of them acts to inhibit the formation of such layer in the other element by effectively lowering the electric field intensity in the other element well below the threshold level necessary to form such high electric field layers. Several embodiments are described with one using capacitive coupling and another resistive or direct coupling.

INVENTORS
HISAYOSHI YANAI
TOSHIAKI IKOMA
TAKAYUKI SUGETA
YASUO MATSUKURA
KUNIICHI OHTA
BY Hopgood & Calimafde
ATTORNEYS

NEURISTOR ELEMENT EMPLOYING BULK EFFECT SEMICONDUCTOR DEVICES

This invention relates to a neuristor element used in an active line capable of the distortionless transmission or the simulation of a neural axon, and more particularly to a neuristor element of the responseless junction type capable of stopping the function of one signal line by the use of a signal applied to another signal line.

The neuristor element, in view of its function of providing a line which enables distortionless transmission, is known as a result of H. D. Crane's report in "Proceedings of the IRE," Oct. 1962, at pages 2048 to 2060. The neuristor element comprises an element of the trigger junction type (hereinafter referred to as the T-junction type), by which a signal applied to a specific but common input terminal is transmitted to two output terminals; and an element of responseless junction type (hereinafter referred to as the R-junction type). By the use of these junction elements, a neuristor line can be formed.

Based on the Crane disclosure, neuristor lines have been embodied wherein an Esaki diode circuit is periodically disposed in a transmission line in the manner such as that shown in "Journal of Institute of Electronics and Communication Engineers of Japan," (in Japanese) Aug. 1966, at pages 1529 to 1537 as reported by Hayasake and Nishizawa. The neuristor line employing Esaki diodes was expected to cover a considerably high frequency region through the utilization of strip lines. This neuristor line is fairly useful in view of its simulation of the nervous mechanism. However, that proposed neuristor line has several serious disadvantages, such as:

Many circuit elements must be used;
the operative frequency region is limited;
mismatching easily ensues; and
additional inductive elements must be provided.

Due to these factors, the achievement of high speed operation of the conventional neuristor line has been retarded, and hence the proposed idea is not suitable for applications to a solid state neuristor line.

It is therefore an object of this invention to provide a neuristor R-junction element for realizing a high speed neuristor line semiconductor element.

Figure 1B:
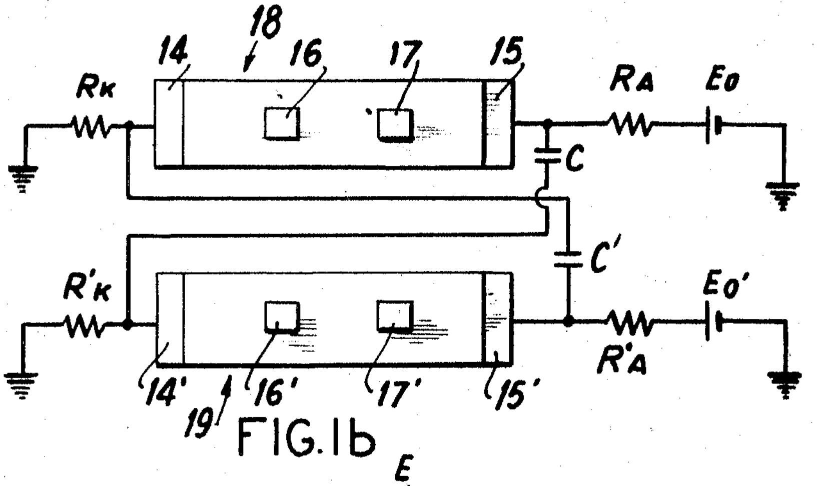
Figure 2A:
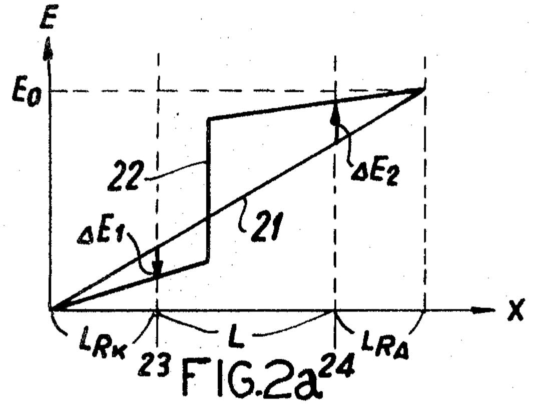
Figure 2B:
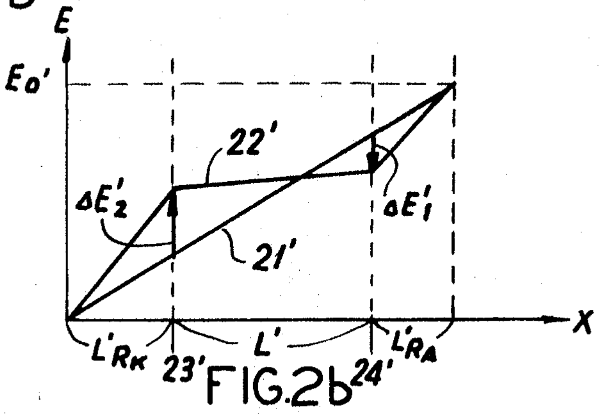
Figure 3:
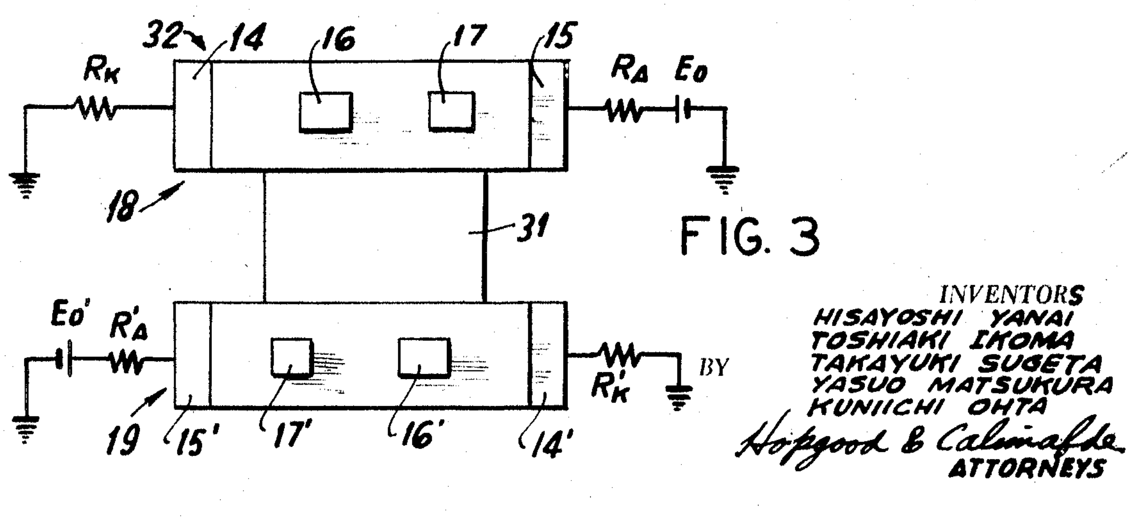

It is a further object of this invention to provide a neuristor element utilizing bulk effect semiconductor materials capable of producing a high field domain traveling from one electrode to another electrode. The above-mentioned and other features and objects of this invention and the manner of attaining them will become more apparent and the invention itself will best be understood by reference to the following description of embodiments of the invention taken in conjunction with the accompanying drawings, the description of which follows:

FIG. 1*a* is a longitudinal sectional view of a semiconductor element used for a preferred embodiment of this invention;

FIG. 1*b* is a circuit diagram showing an embodiment of this invention;

FIGS. 2*a* and 2*b* are potential vs. distance characteristic curves illustrating the operation of the neuristor element according to this invention; and FIG. 3 is a circuit diagram showing a semiconductor element in plan view for illustrating another embodiment of this invention.

As mentioned in the foregoing reports, the neuristor element must have the following properties:

1. a waveform shaping function
2. two distinct states defined by a threshold value
3. a constant propagation speed
4. a bidirectional capability.

Generally, the bidirectional function can be obtained by suitably combining the T-junction and R-junction elements into a circuit. Recently, a semiconductor element utilizing a high electric field layer which is attributable to the bulk negative resistance effect (or so-called Gunn effect) has been noted as a significant high speed logic element. The mechanism of the high electric field layer and associated semiconductors capable of producing it are explained in "-Denshi Zairyo" (Electronic Materials), May 1967, pages 20—24, or U.S. Pat. No. 3,365,583 issued to I.B.M. The semiconductor element utilizing this high electric field layer has the properties required for the neuristor element. In other words the bulk effect semiconductor material waveform shapes a signal given to an input electrode as can be seen from the output signal obtained from the high electric field layer passing immediately beneath an output electrode. The bulk effect semiconductor material exhibits a threshold value function by producing a high electric field layer above a threshold electric field biasing voltage applied across a cathode and an anode electrode attached to the semiconductor material. The high electric field layer is propagated from the cathode to the anode at a specific drift velocity, and the input electrode becomes responseless during the existence of a high electric field layer in the semiconductor material.

Briefly stated, therefore, an R-junction neuristor element according to this invention contemplates input and output means coupled to two semiconductor materials utilizing high electric field layers produced due to bulk negative resistance effect characteristics. The semiconductor materials are so coupled to one another that the high electric field layer initiated in one of the semiconductor materials causes a negative feedback function in the other material so as to suppress or inhibit formation of a high electric field layer in the other semiconductor material.

The R-junction neuristor element according to this invention is highly useful, particularly in view of its fast response as well as the traveling speed of the high electric field layer, the simplicity of its structure and the absence of inductance. These features make the neuristor element of this invention highly adaptable to solid circuit applications.

To be more specific, the invention will be explained with reference to the appended drawings.

Referring to FIGS. 1*a* and 1*b*, a preferred embodiment of this invention is shown with an N-type GaAs epitaxial layer 12 containing tellurium as an N-type dopant covered by a dielectric film 13 of silicon oxide. Layer 12 and film 13 are both formed on the surface of a highly insulating GaAs substrate 11. As shown in FIG. 1*b*, bulk effect semiconductor elements 18 and 19 (each of which is preferably fabricated in accord with device shown in FIG. 1*a*) are provided, wherein cathodes 14–14′ and anodes 15–15′ are disposed in ohmic contact thereon respectively on mutually opposite sides of the epitaxial layer 12. Cathodes 14–14′ and anodes 15–15′ supply power to the semiconductor elements. Input electrodes 16–16′ and output electrodes 17–17′ are attached to the silicon oxide film 13. The bulk effect semiconductor elements 18 and 19 are coupled with each other by means of a capacitance element C in such a manner that the cathode 14 is connected to the anode 15′, cathode 14′ is connected to the other anode 15, and power sources $E_0$ and $E_o'$ a are respectively connected to cathodes 14 and 14′ and anodes 15 and 15′ via resistance elements $R_K$, $R_K'$, $R_A$ and $R_A'$, thereby forming an R-junction neuristor element. The internal electric fields of the respective semiconductor elements 18 and 19 are held so as to maintain a high electric field later.

In FIGS. 2*a* and 2*b*, the ordinate represents voltage E and the abscissa represents distance X. In the above-mentioned embodiment, the cathode and anode of one of the semiconductor materials are respectively coupled capacitively with the anode and cathode of the other semiconductor materials as in FIG. 1*b*, so that the development of a high electric field layer in one of the semiconductor materials is restrained for the period during in which a high electric field layer is existent in the other semiconductor material, thus assuring a responseless function necessary for acquiring R-junction properties. In FIG. 2, the abscissa shows the cathode resistance $R_K$ and anode resistance $R_A$, having values dependent upon the resistivity of the semiconductor material and are expressed in terms of lengths $L_{RK}$ and $L_{RA}$. Under steady state conditions, the electric field within each semiconductor element has a constant slope like straight line 21, as shown in FIG. 2*a*. If an input signal is applied to an input electrode of one of the semiconductor materials and triggers the internal electric field above a threshold value necessary to form a high electric field layer, then the impedance of the triggered element is temporarily increased so that the voltage drop across the resistors such as $R_A$ and $R_K$ are reduced. As a result, the electric field in the triggered element takes the form as shown by the slope of straight line 22, and the potential at the cathode end is lowered by $\Delta E_1$ and the potential at the anode end is raised by $\Delta E_2$. This phenomenon is coupled to the other semiconductor material in a negative voltage feedback effect manner by way of the two capacitance elements. As shown in FIG. 2*b*, the potential at the cathode end 23' is raised by $\Delta E_2'$, and the potential at the anode end 24' is lowered by $\Delta E_1'$. Accordingly, a reduced electric field component as shown by the slope of the straight line 22' is formed in said semiconductor material. Since the internal electric field of the other semiconductor material is greatly reduced to a value smaller than that of the threshold electric field, the signal line of this material is cut off. The high electric field layer produced in the triggered material vanishes when it reaches the anode; thereafter the electric fields within the semiconductor materials resume the straight lines 21 and 21', respectively, signifying thereby a termination of the responseless period.

FIG. 3 shows another embodiment of this invention, wherein an R-junction neuristor element 32 suitable for applications to solid state circuits is obtained by mutually reversely connecting the semiconductor materials 18 and 19 as in FIG. 1*b* via a dielectric 31. More specifically, two pieces of semiconductor materials are formed on a common high insulating base (not shown), and a dielectric such as a silicon oxide film, titanium oxide, etc., is buried in the space between the mutually adjacent sides of the semiconductor material. Then the output electrodes 17 and 17' are disposed so as to be symmetrical with respect to the input electrodes 16 and 16', and the voltages $E_o$ and $E_o'$ are supplied thereto from the cathodes 14 and 14' and anodes 15 and 15' via resistance elements $R_K$, $R_K'$, $R_A$ and $R_A'$. In this embodiment, it is desirable that the resistance elements be passive elements composed of the same semiconductor material used therein. As in the case of the first embodiment, the portion near that input electrodes and the portion near the output electrodes of the respective semiconductor materials are coupled with each other by way of a distributed capacitance element 31, whereby one region causes a negative feedback to the other region to effect the function of an R-junction.

In the foregoing embodiments, the semiconductor materials are coupled to each other by way of a capacitance element. However, a resistance element may be used instead of the capacitance element to realize said voltage feedback coupling. Also, the input and output means are not confined to the described input and output electrodes but a direct coupling, PN junction or field effect element may be employed for the same purpose. Further, the functions of input and output electrodes can be added to the cathode or anode. Still further, a semiconductor utilizing production of a high electric field layer, for example, a piezoelectric semiconductor or germanium having trapping centers may be used for the purpose of the semiconductor material of this invention.

The preferred embodiments of the invention have been explained in detail. It is to be noted that the invention is not confined to these embodiments but covers all the neuristor elements as defined in the following claims.

What we claim is:

1. A neuristor element comprising first and second semiconductor materials each having bulk negative resistance effect characteristics capable of generating high electric field layers, anode and cathode electrodes coupled to the ends of said first and second materials for applying biasing electric fields within said first and second materials, first and second cathode resistors respectively coupled to said cathode electrodes, first and second anode resistors respectively coupled to said anode electrodes, an electric field biasing voltage source coupled through said anode and cathode resistors to said cathode and anode electrodes to establish electric fields in said first and second materials below a threshold level necessary to sustain high electric field layer oscillations in said materials, first and second input electrodes and first and second output electrodes respectively coupled to said first and second materials, said input electrodes being located adjacent said cathode electrodes and said output electrodes being located adjacent said anode electrodes, and means for coupling the anode electrode of said second material to the cathode electrode of said first material and for coupling the anode electrode of said first material to the cathode electrode of said second material.

2. The neuristor element of claim 1, in which said coupling means comprises a first capacitor connected between the anode electrode of one of said materials and the cathode electrode of the other of said materials, and a second capacitor connected between the anode electrode of said other of said materials and the cathode electrode of said one of said materials.